United States Patent
Honda et al.

(10) Patent No.: US 8,638,088 B2
(45) Date of Patent: Jan. 28, 2014

(54) LOAD DETECTION FOR SWITCHED-MODE POWER CONVERTERS

(75) Inventors: Jun Honda, El Segundo, CA (US); Jong-Deog Jeong, Rancho Palos Verdes, CA (US)

(73) Assignee: International Rectifier Corporation, El Segundo, CA (US)

( * ) Notice: Subject to any disclaimer, the term of this patent is extended or adjusted under 35 U.S.C. 154(b) by 332 days.

(21) Appl. No.: 13/019,490

(22) Filed: Feb. 2, 2011

(65) Prior Publication Data

US 2012/0194170 A1  Aug. 2, 2012

(51) Int. Cl.
*G01R 25/00* (2006.01)

(52) U.S. Cl.
USPC ..................... 324/76.77; 324/76.41

(58) Field of Classification Search
USPC ....................................... 324/76.77
See application file for complete search history.

(56) References Cited

U.S. PATENT DOCUMENTS

| | | | | |
|---|---|---|---|---|
| 6,873,138 B2 * | 3/2005 | Jacobson | | 323/235 |
| 2009/0316441 A1 * | 12/2009 | Hu | | 363/21.06 |
| 2010/0039836 A1 * | 2/2010 | Gong et al. | | 363/21.13 |
| 2010/0194198 A1 * | 8/2010 | Djenguerian et al. | | 301/31 |
| 2011/0215784 A1 * | 9/2011 | Hoogzaad | | 323/285 |
| 2011/0267844 A1 * | 11/2011 | He et al. | | 363/21.02 |
| 2012/0033453 A1 * | 2/2012 | Gong | | 363/21.02 |

OTHER PUBLICATIONS

Flip-Flop Circuits, Museu das Comunicacoes, Corrieios de Macau, p. 1-5.*

* cited by examiner

*Primary Examiner* — Thomas F Valone
(74) *Attorney, Agent, or Firm* — Farjami & Farjami LLP

(57) ABSTRACT

In one embodiment, a method for detecting a load in a switched-mode power converter is provided. The switched-mode power converter includes high and low-side power switches which are configured to be driven respectively by high and low-side drive signals to provide a switching voltage. The high and low-side drive signals include a plurality of dead-time periods. The method includes monitoring a waveform of the switching voltage and at least one of the high and low-side drive signals. The monitored waveform of the switching voltage is compared to the monitored waveform of the at least one of the high and low-side drive signals to determine whether the switching voltage is high or low during at least one of the dead-time periods. A current measurement of the load is determined based on whether the switching voltage is high or low during the at least one of the dead-time periods.

19 Claims, 4 Drawing Sheets

LOAD DETECTION FOR SWITCHED-MODE POWER CONVERTERS

BACKGROUND OF THE INVENTION

1. Field of the Invention

The present invention is generally in the field of electrical circuits, and more particularly, the invention is in the field of power converter circuits.

2. Background Art

In switched-mode power converters, for example, half-bridge or synchronous buck converters, many applications require detecting the presence of a load and/or the current polarity of a load. For example, it is often necessary to determine load current direction in battery management systems, such as in uninterruptible power supplies, or in typical electronic protection circuits. Where the power converter is, for example, a class D audio amplifier, it is often desirable to detect the presence of a speaker connected to the amplifier. As a particular example, it is desirable to provide power amplifiers with diagnostic features by detecting the presence of speakers connected to the power amplifier when implementing a multi-way speaker system in a passive frequency-dividing network.

Detecting the presence of a load and/or load polarity typically requires taking voltage or current measurements from the power converter. In one approach, load current is sensed using a resistive component, such as a shunt resistor, inserted in the load current path where the voltage drop across the resistive component is determined to measure the load current. However, because the resistive component must carry current, it will dissipate power and reduce efficiency of the power converter. The on-resistance of the power converter's high-side power switch can also be used to measure the load current. This approach is problematic as the on-resistances of power switches can vary significantly unit-to-unit, and are also strongly temperature dependent, thus leading to inaccurate results. Other approaches can use output voltages, however, it is difficult to sense voltage difference in a closed loop system.

Thus, there is a need in the art for a technique to detect the presence of a load and/or the current polarity of a load in a power converter while overcoming the drawbacks and deficiencies in the art.

SUMMARY OF ME INVENTION

Load detection for switched-mode power converters, substantially as shown in and/or described in connection with at least one of the figures, and as set forth more completely in the claims.

DETAILED DESCRIPTION OF THE INVENTION

The present invention is directed load detection for switched-mode power converters. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings.

Figure 1:
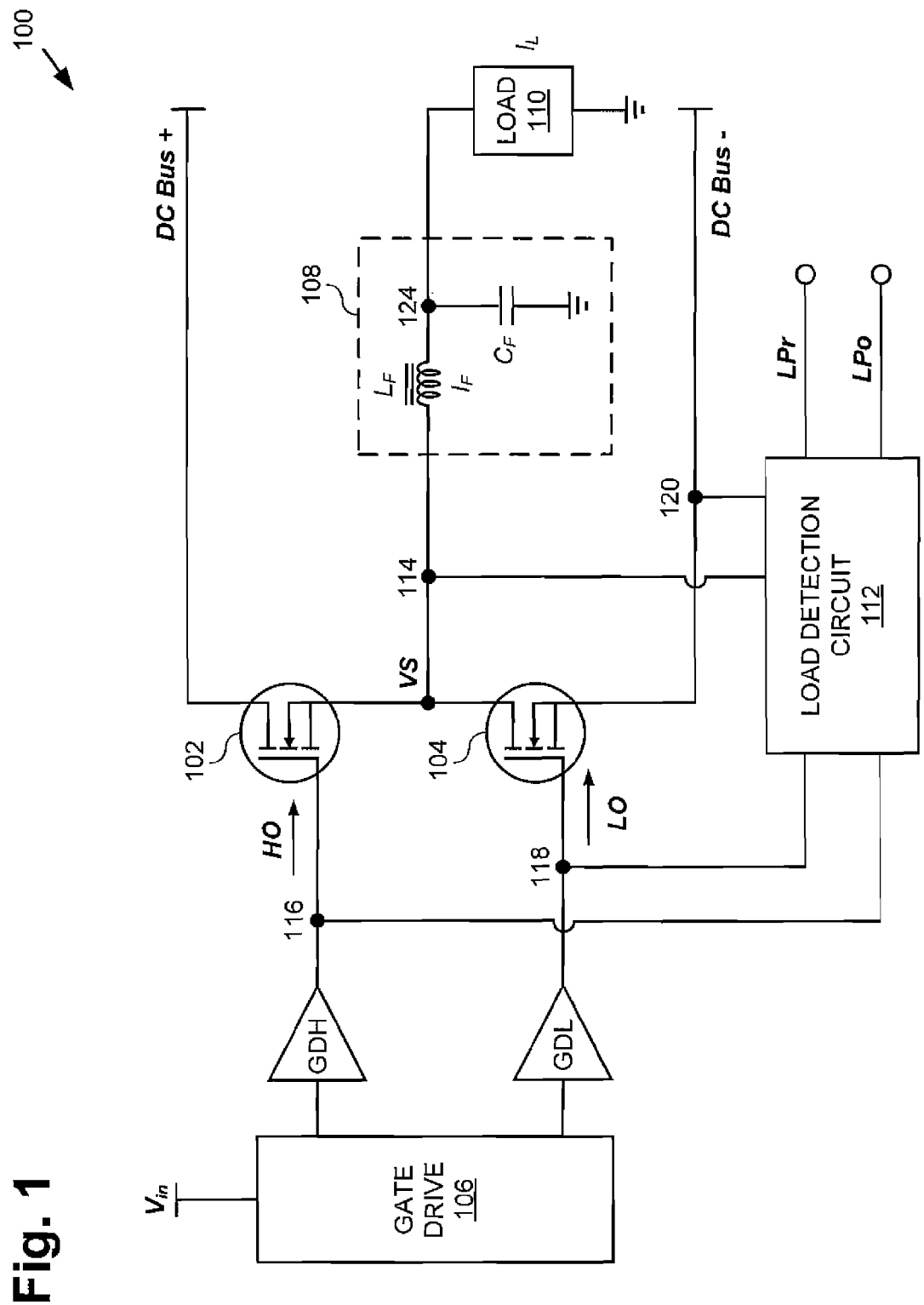
FIG. 1 illustrates an exemplary power converter including a load detection circuit, according to one embodiment of the invention.

FIG. 1 illustrates an exemplary power converter including a load detection circuit, according to one embodiment of the invention. Circuit 100 can comprise a buck converter, and more particularly, a half-bridge or synchronous buck converter. According to one embodiment, circuit 100 can comprise, a class D amplifier. As shown in FIG. 1, circuit 100 includes high-side switch 102, low-side switch 104, high-side gate driver GDH, low-side gate driver GDL, gate drive 106, output filter 108, load 110, and load detection circuit 112.

In FIG. 1, the drain of high-side switch 102 is coupled to DC bus +, the source of high-side switch 102 coupled to switching node 114, and the gate of high-side switch 102 is coupled to high-side gate driver GDH. FIG. 1 further shows the drain of low-side switch 104 coupled to switching node 114, the source of low-side switch 104 coupled DC bus −, and the gate of low-side switch 104 coupled to low-side gate driver GDL.

In circuit 100, high-side switch 102 and low-side switch 104 are driven respectively by high-side gate driver GDH and low-side gate driver GDL, which are controlled by gate drive 106, to provide switching voltage VS. For example, by providing high-side drive signal HO at node 116, gate drive 106 can selectively enable or disable high-side switch 102 and by providing low-side drive signal LO at node 118, gate drive 106 can selectively enable or disable low-side switch 104.

High and low-side drive signals HO and LO are provided by gate drive 106 based on input voltage $V_{in}$, which comprises a pulse width modulated (PWM) signal. For example, when input voltage $V_{in}$ is high, gate drive 106 can enable high-side switch 102 and disable low-side switch 104 and when input voltage $V_{in}$ is low, gate drive 106 can disable high-side switch 102 and enable low-side switch 104 to generate switching voltage VS at switching node 114. The enabling and disabling of high and low-side switches 102 and 104 includes dead-time periods where both high and low-side switches 102 and 104 are disabled as is known in the art.

In some embodiments, input voltage $V_{in}$ can be generated based on a relatively fixed or slow changing voltage reference. For example, circuit 100 can comprise a DC-DC converter. In other embodiments, input voltage $V_{in}$ can be generated based on a continuously changing or alternating voltage reference. For example, circuit 100 can comprise a class D audio amplifier, where input voltage $V_{in}$ is generated based an audio signal.

FIG. 1 further shows output filter 108 coupled between load 110 and switching node 114. In the embodiment shown in FIG. 1, output filler 108 comprises an LC filter including inductor $L_f$ coupled to switching node 114 and coupled to load 110 at node 124. Thus, during operation, inductor $L_f$ carries load current $I_L$. Output filter 108 also includes capacitor $C_f$ coupled between inductor $L_f$ at node 124 and ground. In FIG. 1, load 110 is coupled between output filter 108 at node 124 and ground.

In the embodiment shown in FIG. 1, load detection circuit 112 is coupled to circuit 100 at nodes 116, 118, and 114. Thus, load detection circuit 112 can monitor high-side drive signal HO using node 116, low-side drive signal LO using node 118, and switching voltage VS using switching node 114. Load detection circuit 112 can optionally be coupled to, for example, DC bus − at node 120 to power load detection circuit 112. In some embodiments nodes 114, 116, 118, and 120 can correspond to pins of an integrated circuit (IC), which are already present in a conventional power converter IC. Thus, load detection circuit 112 can be implemented without requiring additional IC pins, which could otherwise introduce substantial cost.

In circuit 100, load detection circuit 112 can detect the presence and/or the polarity of load 110. In the embodiment shown in FIG. 1, load detection circuit 112 has inputs high-side drive signal HO, low-side drive signal LO, and switching voltage VS and has outputs load presence LPr and load polarity LPo. Load presence LPr indicates whether a load, for example, load 110, is present in circuit 100. Whether load 110 is present in circuit 100 depends on measurement of load current $I_L$. Load polarity LPo indicates the polarity of a load, for example, of load 110, connected to circuit 100. For example, load polarity LPo can indicate whether load current $I_L$ is negative or positive depending on measurement of load current $I_L$. In other words, load detection circuit 112 can detect that load current $I_L$ is negative and load 110 is sinking current to the power converter and load detection circuit 112 can detect that load current $I_L$ is positive and load 110 is sourcing current from the power converter.

Although the embodiment shown in FIG. 1 has output signals load presence LPr and load polarity LPo, in other embodiments load detection circuit 112 can have different configurations. For example, in some embodiments load detection circuit 112 can have only load presence LPr. In other embodiments load detection circuit 112 can have only load polarity LPo, where load polarity LPo can indicate, for example, a negative load current and can be used in a protection circuit.

Load detection circuit 112 is configured to detect the presence of load 110 and/or the polarity of load current $I_L$ by measuring load current $I_L$ and detecting the presence of load 110 and/or the polarity of load current $I_L$ using the measurement. The measurement is determined based on whether switching voltage VS is high or low during at least one dead-time period. The measurement is performed by monitoring a waveform of switching voltage VS and monitoring at least one waveform of high and low-side drive signals HO and LO and comparing the monitored waveform of switching voltage VS to the monitored waveform of the at least one waveform of high and low-side drive signals HO and LO to determine whether switching voltage VS is high or low during the dead-time period. Load detection circuit 112 can perform the comparison using small and inexpensive logic devices. Thus, load detection circuit 112 can avoid conventional current and voltage sensing approaches. For example, load detection circuit 112 does not require resistive components to be inserted into the power converter current path and can avoid substantial power dissipation.

Load detection circuit 112 can determine the measurement of load current $I_L$ based on whether switching voltage VS is high or low during at least one dead-time period due to the nature of switching voltage VS during dead-time. More particularly, during dead-time, whether switching voltage VS is high or low is determined by the magnitude and polarity of load current $I_L$, as opposed to high and low-side drive signals HO and LO.

Figure 2:
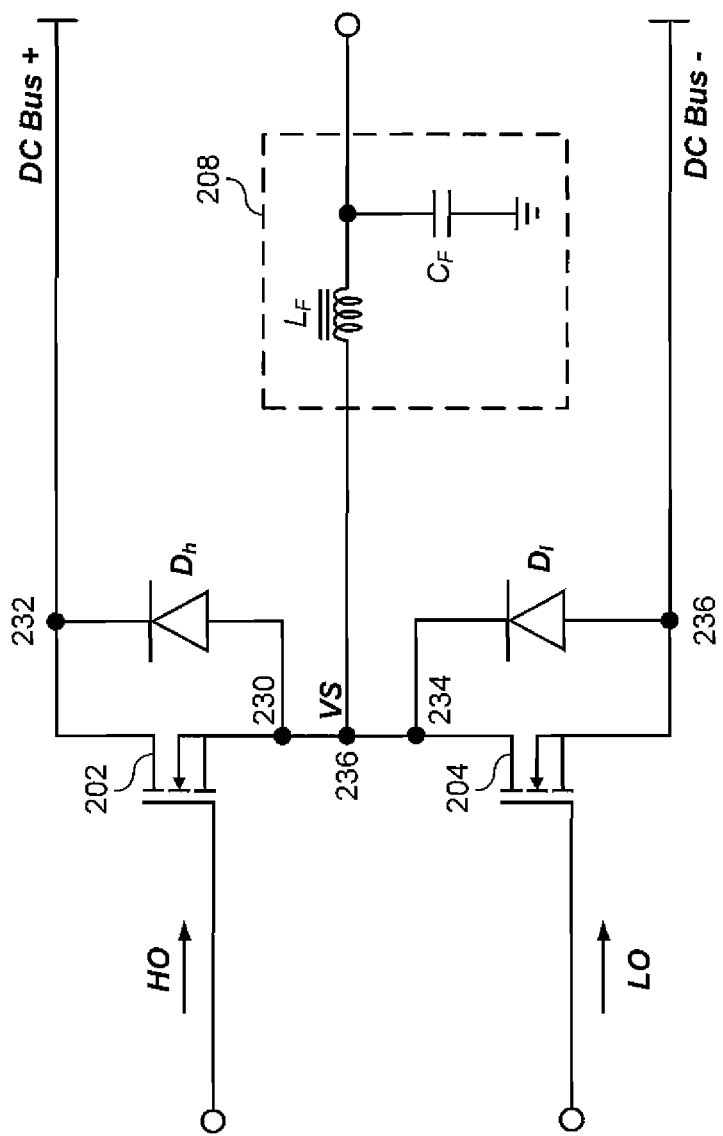
FIG. 2 illustrates in more detail a portion of an exemplary power converter according to one embodiment of the invention.

Referring to FIG. 2, FIG. 2 shows circuit 200 corresponding to circuit 100 in FIG. 1. For example, FIG. 2 shows high-side switch 202, low-side switch 204, and output filter 208 corresponding to high-side switch 102, low-side switch 104, and output filter 108 in FIG. 1.

FIG. 2 also shows high and low-side diodes $D_h$, and $D_l$ (not shown in FIG. 1). As shown in FIG. 2, high and low-side diodes $D_h$ and $D_l$ are respectively coupled across high and low-side switches 202 and 204. More particularly, the anode of high-side diode $D_h$ is coupled to the source of high-side switch 202 at node 230 and the cathode of high-side diode $D_h$ is coupled to the drain of high-side switch 202 and DC bus + at node 232. The cathode of low-side diode $D_l$ is coupled to the drain of low-side switch 204 at node 234 and the anode of lop-side diode $D_l$ is coupled to the source of low-side switch 204 and DC bus − at node 236.

High and low-side diodes $D_h$ and $D_l$ can provide a current path across high and low-side switches 202 and 204 respectively during dead-time, such that switching voltage VS can depend on the magnitude and polarity of load current $I_L$ during dead-time.

Figure 3:
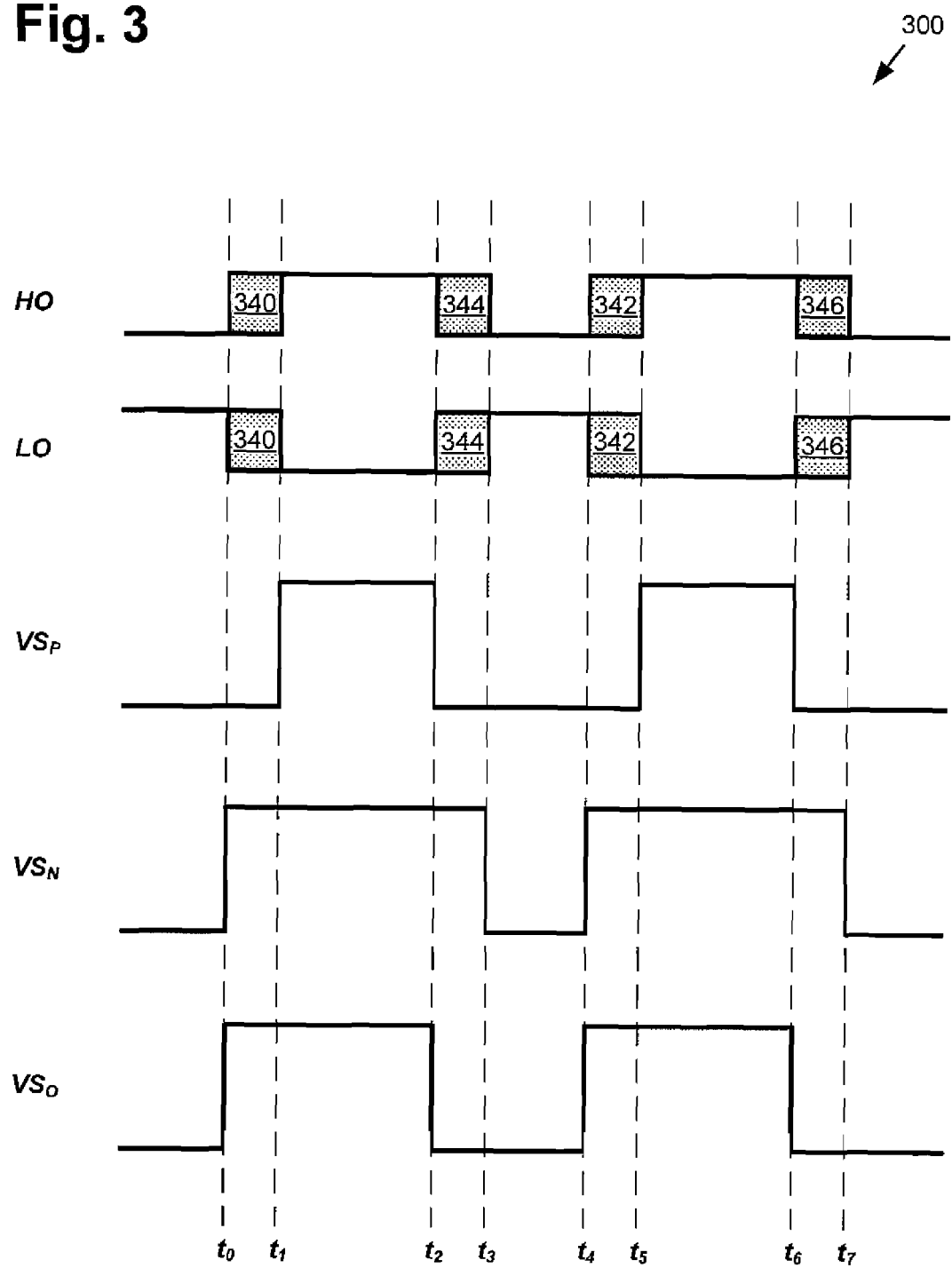
FIG. 3 illustrates exemplary drive signals and switching voltages, according to one embodiment of the invention.

Referring FIG. 3, FIG. 3 shows waveform representations of high and low-side drive signals HO and LO and switching voltages $SV_p$, $SV_n$, and $SV_o$. High and low-side drive signals HO and LO can respectively correspond to high and low-side drive signals HO and LO in FIGS. 1 and 2 during operation of circuits 100 and 200. Switching voltages $SV_p$, $SV_n$, and $SV_o$ can each correspond to switching voltage VS in FIGS. 1 and 2 under different conditions depending on the magnitude and polarity of load current $I_L$ during operation of circuits 100 and 200.

Waveform graph 300 shows times $t_0$, $t_1$, $t_2$, $t_3$, $t_4$, $t_5$, $t_6$, and $t_7$, which represent different times in each waveform shown in FIG. 3. Each waveform in waveform graph 300 represents voltage at given time during operation of circuits 100 and 200. For example, high-side drive signal HO is high between times $t_1$ and $t_2$ is low between times $t_2$ and $t_5$. Similarly, low-side drive signal LO is low between times $t_0$ and $t_3$ and is high between times $t_3$ and $t_4$. Thus, between times $t_1$ and $t_2$ high-side switch 202 in FIG. 2 is ON and low-side switch 204 is OFF and between times $t_3$ and $t_4$ high-side switch 202 in FIG. 2 is OFF and low-side switch 204 is ON.

FIG. 3 also shows low-to-high dead-time periods 340 and 342 and high-to-low dead-time periods 344 and 346, during which high and low-side switches 202 and 204 are both OFF. Normally, during the operation of circuit 200, switching voltage VS is determined by high and low-side drive signals HO and LO. As an example, between times $t_1$ and $t_2$, high-side drive signal HO is high and low-side drive signal LO is low. Thus, low-side switch 204 is OFF, high-side switch 202 is ON, and switching node 236 is connected to DC bus + through high-side switch 202 thereby holding switching voltage $VS_p$ high. Between times $t_3$ and $t_4$, high-side drive signal HO is low and low-side drive signal LO is high. Thus, low-side switch 204 is ON, high-side switch 202 is OFF, and switching node 236 is connected to DC bus − through low-side switch 204 thereby holding switching voltage $VS_p$ low. However, during dead-time, for example, during dead-time periods 340, 342, 344, and 346, high and low-side switches 202 and 204 are both OFF and thus cannot control whether switching node 236 is connected to DC bus − or DC bus +. Rather, during dead-time, whether switching voltage VS is high or low depends on the magnitude and polarity of inductor current $I_L$.

When load current $I_L$ is sufficiently positive, in other words, when load 110 is present and sourcing current from the power converter to a sufficient degree, switching voltage VS corresponds to switching voltage $VS_p$. As shown in FIG. 3, switching voltage $VS_p$ is low during each of low-to-high dead-time periods 340 and 342 and high-to-low dead-time periods 344 and 346. This is because load current $I_L$ is sufficient in magnitude to hold current $I_F$ positive when factoring in the effects of inductor ripple current. More particularly, inductor ripple current is negative while low-side switch 204 is ON and high-side switch 202 is OFF and is positive while high-side switch 202 is ON and low-side switch 204 is OFF. As long as the magnitude of load current $I_L$ is sufficiently positive to hold current $I_F$ positive, even when inductor ripple current is negative, low-side diode $D_l$ will be forward biased during dead-time periods 340, 342, 344, and 346 thereby coupling switching node 236 to DC bus − and holding switching voltage $VS_p$ low as shown in FIG. 3.

Conversely, when load current $I_L$ is sufficiently negative, in other words, when load 110 is present and sinking current to the power converter to a sufficient degree, switching voltage VS corresponds to switching voltage $VS_n$. As shown in FIG. 3, switching voltage $VS_n$ is high during each of low-to-high dead-time periods 340 and 342 and high-to-low dead-time periods 344 and 346. This is because load current $I_L$ is sufficient in magnitude to hold current $I_F$ negative when factoring in the effects of inductor ripple current. More particularly, as long as the magnitude of load current $I_L$ is sufficiently negative to hold current $I_F$ negative, even when inductor ripple current is positive, high-side diode $D_h$ will be forward biased during dead-time periods 340, 342, 344, and 346 thereby coupling switching node 236 to DC bus + and holding switching voltage $VS_n$ high as shown in FIG. 3.

When load current $I_L$ is sufficiently small in magnitude, for example, when load 110 is not present in circuit 100, switching voltage VS corresponds to switching voltage $VS_o$. As shown in FIG. 3, switching voltage $VS_o$ is high during low-to-high dead-time periods 340 and 342 and is low during high-to-low dead-time periods 344 and 346. This is because while load current $I_L$ is sufficiently small in magnitude, whether each of high or low-side diodes $D_h$ and $D_l$ are forward biased depends on the polarity of inductor ripple current immediately prior to each dead-time period. More particularly, load current $I_L$ is not sufficient in magnitude to hold current $I_F$ either positive or negative during each dead-time period 340, 342, 344, and 346.

For example, prior to each low-to-high dead-time period 340 and 342, high-side switch 202 is OFF and low-side switch 204 is ON connecting switching node 236 to DC bus −. Thus, inductor ripple current and current $I_F$ are negative entering into low-to-high dead-time periods 340 and 342 and high-side diode $D_h$ will be forward biased during low-to-high dead-time periods 340 and 342, thereby connecting switching node 236 to DC bus + and holding switching voltage $VS_o$ high, as shown in FIG. 3. Conversely, prior to each high-to-low dead-time period 344 and 346, high-side switch 202 is ON and low-side switch 204 is OFF connecting switching node 236 to DC bus +. Thus, inductor ripple current and current $I_F$ are positive entering into high-to-low dead-time periods 344 and 346 and low-side diode $D_l$ will be forward biased during high-to-low dead-time periods 344 and 346, thereby connecting switching node 236 to DC bus − and holding switching voltage $VS_o$ low, as shown in FIG. 3.

As shown in FIG. 3, waveforms of $VS_n$, $VS_p$, and $VS_o$ are distinct from one another. This is due to forward conduction through high and low-side diodes $D_h$ and $D_l$ during dead-time as described above. In the embodiment shown in FIG. 2, high and low-side diodes $D_h$ and $D_l$ are body diodes in respective high and low-side switches 202 and 204. However, it will be appreciated that high and low-side diodes $D_h$ and $D_l$ can be external to high and low-side switches 202 and 204 so long as high and low-side diodes $D_h$ and $D_l$ allow for conduction during dead-time as described above with respect to FIG. 3.

As described above, whether switching voltage VS is high or low during dead-time depends on the magnitude and polarity inductor current $I_L$. The waveforms of switching voltages $VS_n$, $VS_p$, and $VS_o$, representing various magnitudes and polarities of inductor current $I_L$, are distinct from one another when considering a dead-time cycle, i.e., consecutive dead-time periods, for example low-to-high dead-time period 340 and high-to-low dead-time period 344 or high-to-low dead-time period 344 and low-to-high dead-time period 342. Thus, load detection circuit 112 can determine a measurement of inductor current $I_L$ by determining whether or not switching voltage VS is high or low during dead-time. In other words, load detection circuit 112 can determine whether or not switching voltage VS corresponds to any of the magnitude and polarity conditions of inductor current $I_L$ represented by switching voltages $VS_n$, $VS_p$, and $VS_o$ in FIG. 3. It will be appreciated that the magnitude and polarity of inductor current $I_L$ can change during the operation of the power converter. Thus, switching voltage VS can correspond to different switching voltages $VS_n$, $VS_p$, and $VS_o$ at different times.

Load detection circuit 112 is configured to perform the measurement by monitoring a waveform of switching voltage VS and monitoring at least one waveform of high and low-side drive signals HO and LO and comparing the monitored waveform of switching voltage VS to the monitored waveform of the at least one waveform of high and low-side drive signals HO and LO to determine whether switching voltage VS is high or low during the dead-time period. According to one embodiment, load detection circuit 112 can monitor the waveforms by tracking a timing difference between the waveforms. Load detection circuit 112 can also compare the waveforms based on the timing difference to determine whether switching voltage VS is high or low during the dead-time period. In doing so, load detection circuit 112 can track the edges of any of the waveforms of switching voltage VS and the waveforms of high and low-side drive signals HO and LO.

Figure 4:
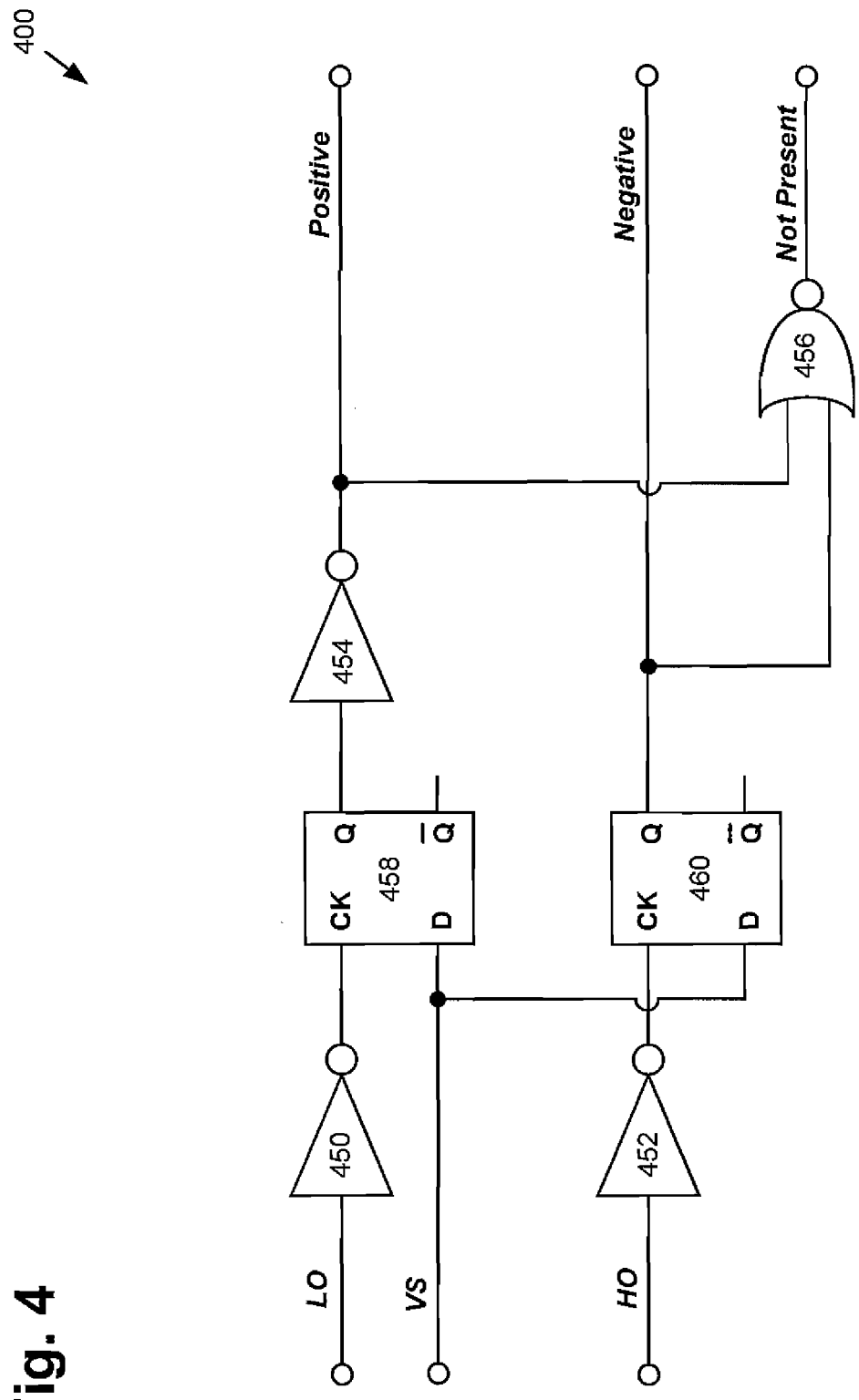
FIG. 4 illustrates exemplary load detection circuitry, according to one embodiment of the invention.

FIG. 4 illustrates exemplary load detection circuitry, according to one embodiment of the invention. FIG. 4 shows load detection circuitry 400, which can correspond to load detection circuit 112 in FIG. 1. As shown in FIG. 4, load detection circuitry 400 has inputs low-side drive signal LO, high-side drive signal HO, and switching voltage VS, corresponding to low-side drive signal LO, high-side drive signal HO, and switching voltage VS in FIGS. 1 and 2. Load detection circuitry 400 also has outputs positive, negative, and not present. In the present embodiment outputs positive, negative, and not present can correspond to a measurement of load current $I_L$, which is determined by load detection circuitry 400. For example, in the present embodiment output positive will only be high when switching voltage VS corresponds to switching voltage $VS_p$ in FIG. 3, output negative will only be high when switching voltage VS corresponds to switching voltage $VS_n$ in FIG. 3, and output not present will only be high when switching voltage VS corresponds to switching voltage $VS_o$ in FIG. 3.

Load detection circuitry 400 can monitor the waveform of switching voltage VS and the waveforms of high and low-side drive signals HO and LO tracking a timing difference between the waveforms. Load detection circuitry 400 can compare the waveform of switching voltage VS to the waveforms of high and low-side drive signals HO and LO based on the timing difference between the waveforms. In doing so, load detection circuitry 400 can track the edges of high and low-side drive signals HO and LO. For example, as shown in FIG. 4, load detection circuitry 400 includes inverters 450, 452, and 454, D flip-flops 458 and 460, and NOR gate 456. D flip-flop 458 tracks the falling edge of high-side drive signal HO and D flip-flop 460 tracks the falling edge of low-side drive signal LO. Thus, load detection circuit 112 can compare the waveform of switching voltage VS to at least one waveform of high and low-side drive signals HO and LO based on timing differences between the waveforms.

Load detection circuit 112 can detect the presence of load 110 and/or the polarity of load current $I_L$ using the measurement of load current $I_L$. More particularly, after determining whether or not switching voltage VS corresponds to any of the magnitude and polarity conditions of inductor current $I_L$ represented by switching voltages $VS_n$, $VS_p$, and $VS_o$. For example, where circuit 100 comprises a DC-DC converter, such as, where $V_{in}$ in FIG. 1 is generated based on a relatively fixed or slow changing voltage reference, load detection circuit 112 can detect that load 110 has positive polarity in circuit 100 based on measuring load current $I_L$ as sufficiently positive in magnitude to correspond to switching voltage $VS_p$ in FIG. 3. Similarly, load detection circuit 112 can detect that load 110 has negative polarity in circuit 100 based on measuring load current $I_L$ as sufficiently negative in magnitude to correspond to switching voltage $VS_n$ in FIG. 3. Furthermore, load detection circuit 112 can detect that load 110 is not present in circuit 100 based on measuring load current $I_L$ as sufficiently small in magnitude to correspond to switching voltage $VS_o$ in FIG. 3.

In one embodiment, load detection circuit 112 can include an event counter and can use the event counter to detect the presence of load 110 and/or the polarity of load current $I_L$ by tracking the measurements of load current $I_L$. More particularly, load detection circuit 112 can track how many times switching voltage VS corresponds to or does not correspond the magnitude and polarity conditions represented by any of switching voltages $VS_n$, $VS_p$, and $VS_o$ in FIG. 3.

An event counter can be used, for example, where load current $I_L$ is changing. As particular example, an event counter can be used where circuit 100 comprises a class D amplifier, such as, where input voltage $V_{in}$ is generated based on a continuously changing or alternating voltage reference, for example, an audio signal. In this case, when load 110 is present, load current $I_L$ will transition from negative to positive as load 110 alternately sinks and sources current from the power converter based on the alternating voltage reference. Thus, switching voltage VS will continuously alternate between the magnitude and polarity conditions represented by switching voltages $VS_o$, $VS_n$, and $VS_p$ in FIG. 3. However, when load 110 is not present, switching voltage VS will continuously correspond to switching voltage $VS_o$. Thus, in some embodiments load detection circuit 112 can detect the presence of load 110 and/or the polarity of load current $I_L$ based on the event counter tracking how many times switching voltage VS corresponds to or does not correspond to any of switching voltages $VS_n$, $VS_p$, and $VS_o$.

Detection of the presence of load 110 and/or the polarity of load current $I_L$ can be improved by adjusting the ratio between dead-time and non-dead-time during measurement of load current $I_L$ so that dead-time is longer relative to non-dead-time. For example, in one embodiment, each dead-time period can be widened while non-dead-time is held-constant. In another embodiment, each dead-time period can be held constant while non-dead-time is reduced. Thus, the differences between the waveform of switching voltage VS and at least one waveform of high and low-side drive signals HO and LO will become more pronounced, which can improve the accuracy of monitoring and comparing the waveforms.

Detection of the presence of load 110 and/or the polarity of load current $I_L$ can also be improved by adjusting the voltages of DC bus + and DC bus −. For example, by lowering the supply voltages DC bus + and DC bus − inductor ripple current is reduced, such that, for example, the magnitude of load current $I_L$ would not have to be as positive to hold current $I_F$ positive, even when inductor ripple current is negative. Thus, by lowering the voltages of DC bus + and DC bus − load detection circuit 112 can more accurately detect the presence of load 110 and/or the polarity of load current $I_L$ given, for example, a smaller load current $I_L$.

In some embodiments, load detection circuit 112 operates during a diagnostic process separate from regular operation of circuit 100. This is advantageous because during the diagnostic process, for example, during startup of a class D audio amplifier, variables such as the duration of dead-time and non-dead-time and DC bus voltages are less critical to performance of the power converter than during regular operation where, for example, dead-time should be minimized.

Thus, as described above, according to various embodiments, the invention achieves a load detection circuit that can detect the presence and/or polarity of a load in a switched-mode power converter. The load detection circuit can detect the presence and/or polarity of the load by measuring load current and detecting the presence and/or the polarity of the load current using the measurement. The measurement is based on whether switching voltage VS is high or low during a dead-time period. Thus, the load detection circuit can avoid conventional current and voltage sensing approaches and can be implemented using small and inexpensive logic devices.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A method for detecting a load in a switched-mode power converter, said switched-mode power converter comprising high and low-side power switches, said high and low-side power switches configured to be driven respectively by high and low-side drive signals to provide a switching voltage, said high and low-side drive signals including dead-time periods, said method comprising:
   performing a comparison between a waveform of said switching voltage and a waveform of at least one of said high and low-side drive signals to determine whether said switching voltage is high or low during at least one of said dead-time periods;
   detecting said load based on whether said switching voltage is high or low during said at least one of said dead-time periods as determined by said comparison.

2. The method of claim 1, wherein said detecting utilizes a measurement of current of said load, said measurement based on whether said switching voltage is high or low during said at least one of said dead-time periods as determined by said comparison.

3. The method of claim 1 further comprising monitoring said waveform of said switching voltage and said waveform of at least one of said high and low-side drive signals prior to said performing said comparison.

4. The method of claim 1 further comprising detecting a polarity of said load in said switched-mode power converter.

5. The method of claim 3, wherein said monitoring comprises tracking a timing difference between said waveform of said switching voltage and said waveform of said at least one of said high and low-side drive signals.

6. The method of claim 3, wherein monitoring comprises tracking an edge of said waveforms of said switching voltage or an edge of said waveform of said at least one of said high and low-side drive signals.

7. The method of claim 3, wherein monitoring comprises tracking a falling edge of said waveform of said at least one of said high and low-side drive signals.

8. The method of claim 1, wherein said waveform of said switching voltage and said waveform of said at least one of said high and low-side drive signals are monitored and compared using a D flip-flop.

9. The method of claim 1 further comprising tracking said current of said load using an event counter.

10. The method of claim 1 further comprising adjusting a ratio between dead-time and non-dead-time in said high and low-side drive signals such that dead-time is longer than non-dead-time.

11. A load detection circuit for detecting a load in a switched-mode power converter, said switched-mode power converter comprising high and low-side power switches, said high and low-side power switches configured to be driven respectively by high and low-side drive signals to provide a switching voltage, said high and low-side drive signals including dead-time periods, said load detection circuit being configured to:

perform a comparison between a waveform of said switching voltage and a waveform of at least one of said high and low-side drive signals to determine whether said switching voltage is high or low during at least one of said dead-time periods;

detect said load based on whether said switching voltage is high or low during said at least one of said dead-time periods as determined by said comparison.

12. The load detection circuit of claim 11, wherein said load detection circuit detects said load by utilizing a measurement of current of said load, said measurement being based on whether said switching voltage is high or low during said at least one of said dead-time periods as determined by said comparison.

13. The load detection circuit of claim 11, wherein said load detection circuit is further configured to monitor said waveform of said switching voltage and said waveform of at least one of said high and low-side drive signals.

14. The load detection circuit of claim 11, wherein said load detection circuit is further configured to detect a polarity of said load in said switched-mode power converter.

15. The load detection circuit of claim 13, wherein said load detection circuit is further configured to track a timing difference between said waveform of said switching voltage and said waveform of said at least one of said high and low-side drive signals.

16. The load detection circuit of claim 13, wherein said load detection circuit is further configured to track an edge of said waveforms of said switching voltage or an edge of said waveform of said at least one of said high and low-side drive signals.

17. The load detection circuit of claim 13, wherein said load detection circuit is further configured to track a falling edge of said waveform of said at least one of said high and low-side drive signals.

18. The load detection circuit of claim 11, wherein said load detection circuit is further configured to use a D flip-flop to monitor and compare said waveform of said switching voltage and said waveform of said at least one of said high and low-side drive signals.

19. The load detection circuit of claim 11, wherein said load detection circuit is further configured to track said current of said load using an event counter.

* * * * *